United States Patent
Lee et al.

(10) Patent No.: US 8,349,636 B2
(45) Date of Patent: Jan. 8, 2013

(54) METHOD OF MANUFACTURING A PHASE CHANGE MEMORY DEVICE USING A CROSS PATTERNING TECHNIQUE

(75) Inventors: Jang Uk Lee, Gyeonggi-do (KR); Kang Sik Choi, Gyeonggi-do (KR); Hae Chan Park, Gyeonggi-do (KR); Jin Hyock Kim, Gyeonggi-do (KR); Ja Chun Ku, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 372 days.

(21) Appl. No.: 12/834,141

(22) Filed: Jul. 12, 2010

(65) Prior Publication Data

US 2011/0143477 A1    Jun. 16, 2011

(30) Foreign Application Priority Data

Dec. 16, 2009    (KR) .................... 10-2009-0125598

(51) Int. Cl.
 *H01L 21/00* (2006.01)
(52) U.S. Cl. .................. 438/54; 438/382; 257/E21.645
(58) Field of Classification Search .................. 438/54, 438/237
 See application file for complete search history.

(56) References Cited

U.S. PATENT DOCUMENTS

| | | | |
|---|---|---|---|
| 7,031,185 B2 * | 4/2006 | Perner et al. | 365/171 |
| 7,244,956 B2 * | 7/2007 | Pellizzer | 257/2 |
| 7,511,297 B2 * | 3/2009 | Jang et al. | 438/102 |

FOREIGN PATENT DOCUMENTS

| KR | 100782496 B1 | 11/2007 |
|---|---|---|
| KR | 1020090096037 A | 9/2009 |

* cited by examiner

*Primary Examiner* — Chandra Chaudhari
(74) *Attorney, Agent, or Firm* — Ladas & Parry LLP

(57) ABSTRACT

A method of manufacturing a phase change memory device is provided. A first insulating layer having a plurality of metal word lines spaced apart at a constant distance is formed on a semiconductor substrate. A plurality of line structures having a barrier metal layer, a polysilicon layer and a hard mask layer are formed to be overlaid on the plurality of metal word lines. A second insulating layer is formed between the line structures. Cross patterns are formed by etching the hard mask layers and the polysilicon layers of the line structures using mask patterns crossed with the metal word lines. A third insulating layer is buried within spaces between the cross patterns. Self-aligned phase change contact holes are formed and at the same time, diode patterns formed of remnant polysilicon layers are formed by selectively removing the hard mask layers constituting the cross patterns.

13 Claims, 6 Drawing Sheets

METHOD OF MANUFACTURING A PHASE CHANGE MEMORY DEVICE USING A CROSS PATTERNING TECHNIQUE

CROSS-REFERENCES TO RELATED APPLICATION

This application claims priority under 35 U.S.C. 119(a) to Korean application number 10-2009-0125598, filed on Dec. 16, 2009, in the Korean Patent Office, which is incorporated by reference in its entirety as if set forth in full.

BACKGROUND OF THE INVENTION

1. Technical Field

The inventive concept relates to a method of manufacturing a phase change memory device and, more particularly, to a method of manufacturing a phase change memory device using a cross patterning technique.

2. Related Art

So as to improve the integration degree of semiconductor devices, fine patterns should be indispensably fabricated. That is, so as to integrate many elements in the defined area, individual elements should be scaled down. Miniaturization to line widths and spaces of the patterns should be preceded in order to reduce the sizes of the individual elements. Currently, it requires a line width below the resolution of the photolithographic light source in semiconductor devices, especially memory devices, so that it is difficult to form fine patterns.

Various methods of fabricating fine patterns have been researched and the cross patterning technique as a part of fine pattern formation method is suggested. A cross patterning technique is a method for fabricating patterns of fine line widths at intersections by carrying out a double patterning process in the form of orthogonal lines.

Currently, the diodes of the phase change memory device are fabricated by using the crossing patterning technique. That is, in the prior art, a metal layer for a word line, a barrier metal layer and a polysilicon layer are stacked and then double patterned by the cross patterning method to fabricate word lines and vertical diodes.

However, when the word lines are fabricated by the prior method, the polysilicon layer, the barrier metal layer and the metal layer for a word line having constant thicknesses are etched at a time so that the etching is heavily burdened, making it difficult to fabricate perfect patterns.

SUMMARY

According to one aspect of an exemplary embodiment, a method of manufacturing a phase change memory device is provided. A first insulating layer, which a plurality of metal word lines spaced apart at a constant distance are formed in, is formed on a semiconductor substrate. A plurality of line structures are formed to be overlaid on the plurality of metal word lines, each of the plurality of line structures including a barrier metal layer, a polysilicon layer and a hard mask layer, for example. A second insulating layer is buried between the line structures. Cross patterns are formed by etching the hard mask layers and the polysilicon layers constituting the plurality of line structures using mask patterns crossed with the metal word lines. A third insulating layer is buried within spaces between the cross patterns. Self-aligned phase change contact holes are formed and at the same time, diode patterns formed of remnant polysilicon layers are formed by selectively removing the hard mask layers constituting the cross patterns.

According to another aspect of another exemplary embodiment, a method of manufacturing a phase change memory device is provided. A semiconductor substrate on which a plurality of metal word lines insulated from each other are formed on and having a planarized surface is provided. A plurality of line structures are formed to be overlaid on the plurality of metal word lines, each of the plurality of line structures including a barrier metal layer, a polysilicon layer for a diode and a hard mask layer, for example. An insulating layer is buried between the line structures. Cross patterns are formed by etching the hard mask layers and the polysilicon layers constituting the plurality of line structures by using mask patterns crossed with the plurality of metal word lines.

According to still another aspect of still another exemplary embodiment, a method of manufacturing a phase change memory device is provided. A plurality of line structures are formed on a semiconductor substrate, each of the plurality of line structures including a metal word line, a barrier metal layer, a polysilicon layer and a hard mask layer sequentially stacked, for example. An insulating layer is buried between the line structures. Cross patterns are formed by etching the hard mask layers and the polysilicon layers of the plurality of line structures by using mask patterns crossed with the line structures. An additional insulating layer is buried within spaces between the cross patterns. Self-aligned phase change contact holes are formed and at the same time, diode patterns formed of remnant polysilicon layers are formed by selectively removing the hard mask layers constituting the cross patterns.

These and other features, aspects, and embodiments are described below in the section entitled "DESCRIPTION OF EXEMPLARY EMBODIMENT".

BRIEF DESCRIPTION OF THE DRAWINGS

The above and other aspects, features and other advantages of the subject matter of the present disclosure will be more clearly understood from the following detailed description taken in conjunction with the accompanying drawings, in which.

DESCRIPTION OF EXEMPLARY EMBODIMENT

Figure 1:
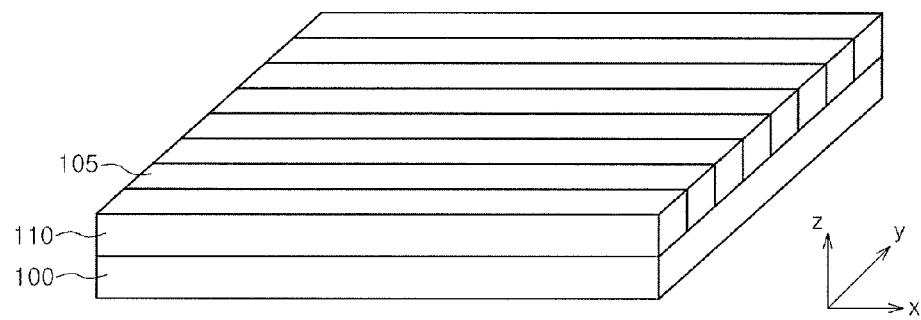
FIGS. 1 through 9 are perspective views illustrating a method of manufacturing a phase change memory device according to an exemplary embodiment of the inventive concept.

Exemplary embodiments are described herein with reference to cross-sectional illustrations that are schematic illustrations of exemplary embodiments (and intermediate structures). As such, variations from the shapes of the illustrations as a result, for example, of manufacturing techniques and/or tolerances, are to be expected. Thus, exemplary embodiments should not be construed as limited to the particular shapes of regions illustrated herein, but may include deviations in shapes that result, for example, from manufacturing. In the drawings, lengths and sizes of layers and regions may be exaggerated for clarity. Like reference numerals in the drawings denote like elements. It is also understood that when a layer is referred to as being "on" another layer or substrate, it can be directly on the other or substrate, or intervening layers may also be present.

FIGS. 1 to 9 are perspective views illustrating a method of manufacturing a phase change memory device according to an exemplary embodiment of the inventive concept.

Referring to FIG. 1, a plurality of metal word lines 110 which are insulated by a first insulating layer 105 are formed on a semiconductor substrate 100. The semiconductor substrate 100 may include a junction word line (not shown) formed by implanting impurities, for example. The first insulating layer 105 is deposited on the semiconductor substrate 100 and portions of the first insulating layer 105 are etched to form a plurality of line type grooves (not shown). Next, a metal layer for a word line is deposited to be sufficiently buried within the plurality of line type grooves and then chemically mechanically polished to expose the first insulating layer 105, thereby forming the damascene type metal word lines 110. In the exemplary embodiment, the metal word lines 110 are formed by a damascene etching process. On the other hand, first, the metal word lines 110 may be formed and then the first insulating layer 105 may be buried between the metal word lines 110, for example.

Figure 2:
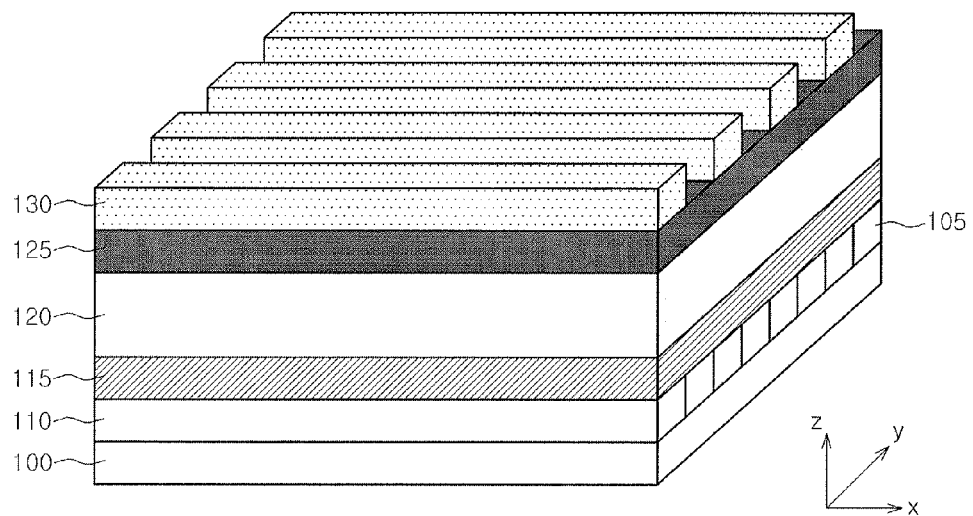

Referring to FIG. 2, a barrier metal layer 115, a polysilicon layer 120 for a diode and a hard mask layer 125 are sequentially deposited on a resultant structure of the semiconductor substrate 100 which the metal word lines 110 are formed on. Next, first photoresist patterns 130 are formed on portions of the hard mask layer 125 which correspond to the metal word lines 110, respectively. In the exemplary embodiment, the barrier metal layer 115 is formed to provide an ohmic contact between the metal word line 110 and the polysilicon layer 120, for example. In the exemplary embodiment, the barrier metal layer 115 induces a substantial shottky junction. The polysilicon layer 120 may be a dopant doped polysilicon layer, for example. The hard mask layer 125 may be a substantial mask layer and for example, may be formed of a silicon nitride layer.

Figure 3:
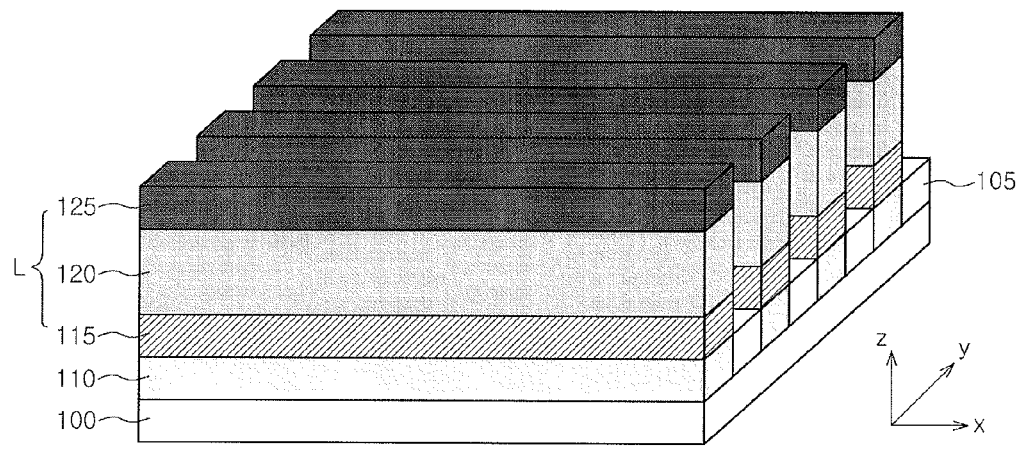

Referring to FIG. 3, the hard mask layer 125 is etched in the form of the first photoresist patterns 130 and then the first photoresist patterns 130 are removed. Next, the polysilicon layer 120 and the barrier metal layer 115 are patterned by using the patterned hard mask layer 125 as an etch mask, thereby forming line structures L. Ideally, the line structures L preferably just correspond to the metal word lines 100, respectively. However, the line structures L may not just correspond to the metal word lines 110 due to misalignment. However, as long as the barrier metal layers 115 of the line structures L are electrically contacted with the metal word lines 110, the barrier metal layers 115 receive signals from the metal word lines 110 and substantially form Schottky junctions with the polysilicon layers 120.

Figure 4:
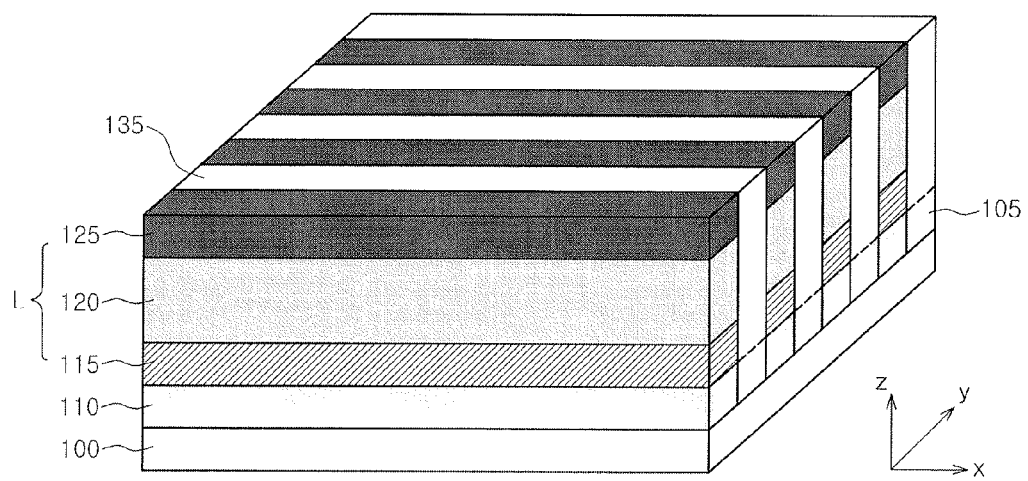

Referring to FIG. 4, a second insulating layer 135 is deposited on a resultant structure of the semiconductor substrate 100 to be buried within spaces between the line structures L. Then, the second insulating layer 135 is chemically mechanically polished to expose surfaces of the hard mask layers 125. According to this, a resultant surface of the semiconductor substrate 100 is flattened.

Figure 5:
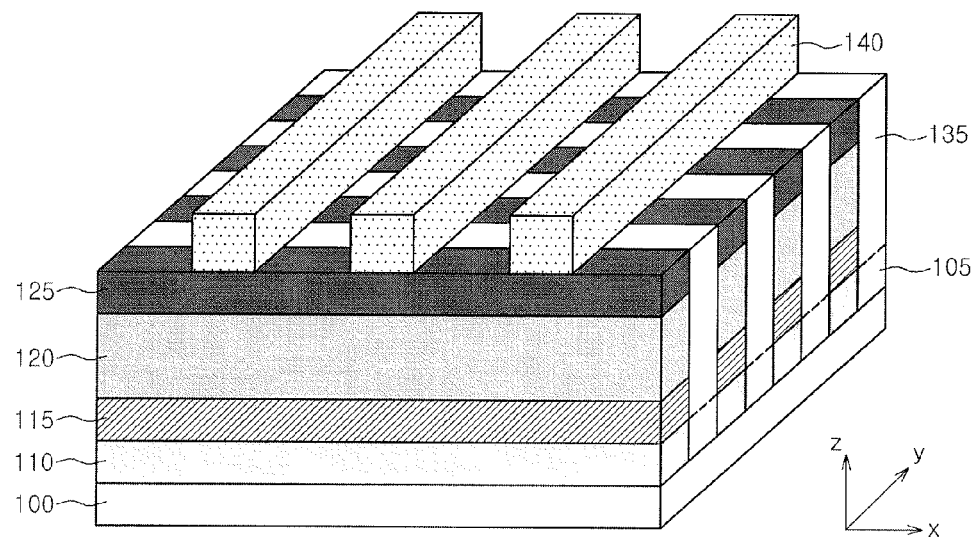

Referring to FIG. 5, a second photoresist pattern 140 which is crossed with the metal word lines 110 and the line structures L is formed on a resultant structure of the semiconductor substrate 100 through a conventional method. The second photoresist pattern 140 may comprise a plurality of line patterns spaced apart at a constant distance, for example.

Figure 6:
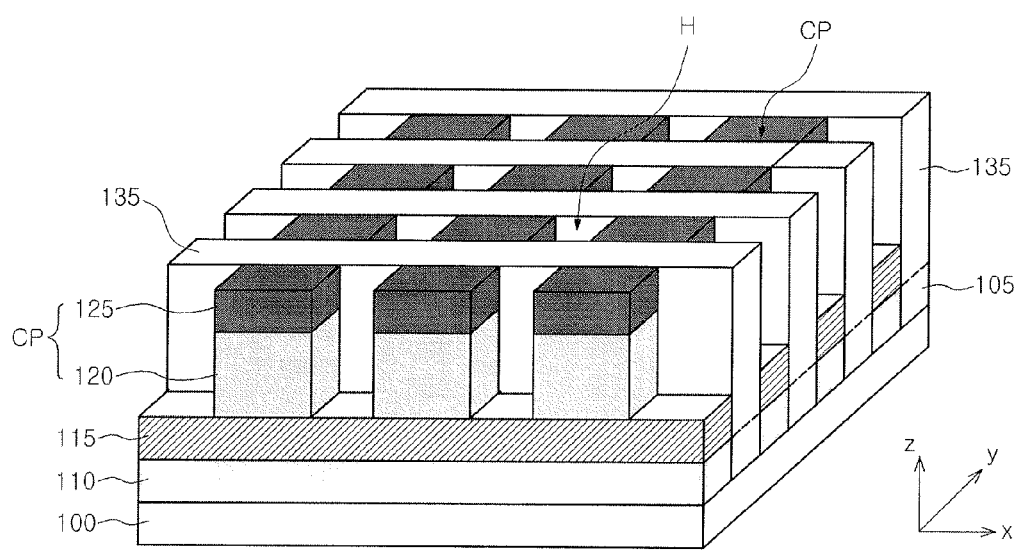

Referring to FIG. 6, the hard mask layers 125 and the polysilicon layers 120 constituting the line structures L are etched in the form of the second photoresist pattern 140. Accordingly, cross patterns CP being comprised of the hard mask layers 125 and the polysilicon layers 120 are formed at the portions corresponding to the intersections of the first and second photoresist patterns 130 and 140. Furthermore, by the etching process, holes H are disposed between the cross patterns CP which are disposed along the elongated direction of the metal word line 110.

Figure 7:
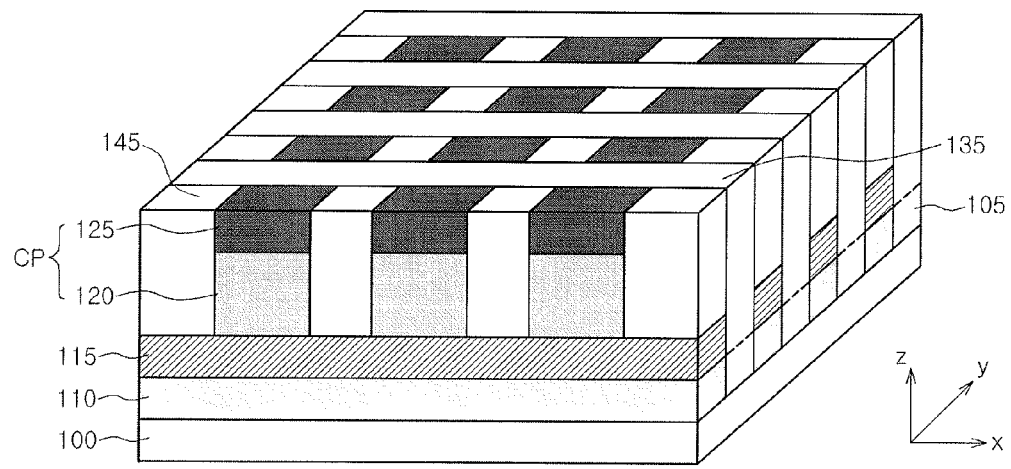

Referring to FIG. 7, a third insulating layer 145 is formed on a resultant structure of the semiconductor substrate 100 to be buried within the holes H. Then, the third insulating layers 145 are chemically mechanically polished until the hard mask layers 125 are exposed.

Figure 8:
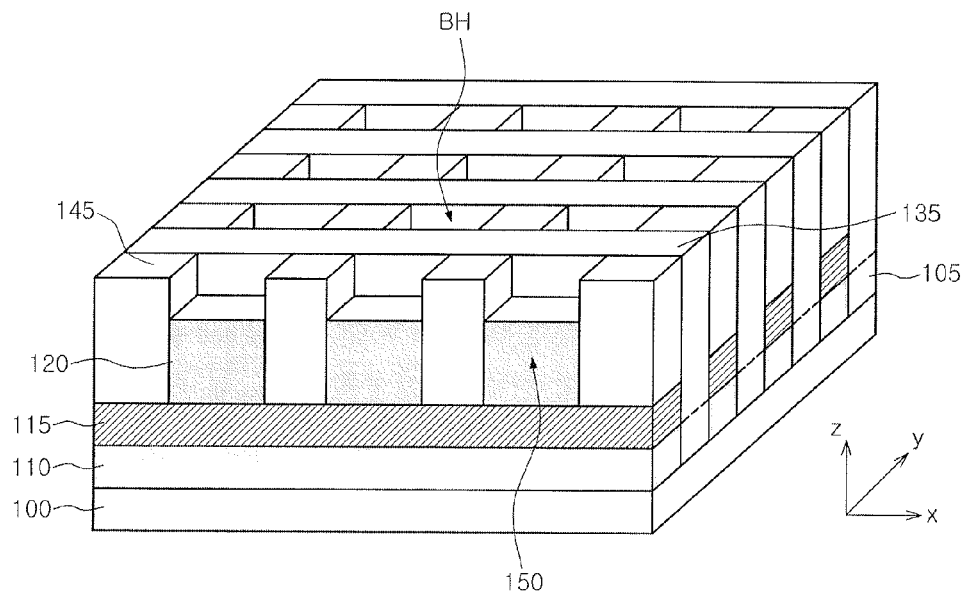

Referring to FIG. 8, the exposed hard mask layers 125 are selectively removed. For example, the hard mask layers 125 are removed by dipping them into a $PH_3$ solution. Due to removal of the hard mask layers 125, diode patterns 150 formed of the polysilicon layers 120 remain at the intersections of the first and second photoresist patterns 130 and 140 and self-aligned phase change contact holes BH surrounded by the second and third insulating layers 135 and 145 are defined on the diode patterns 150.

Figure 9:
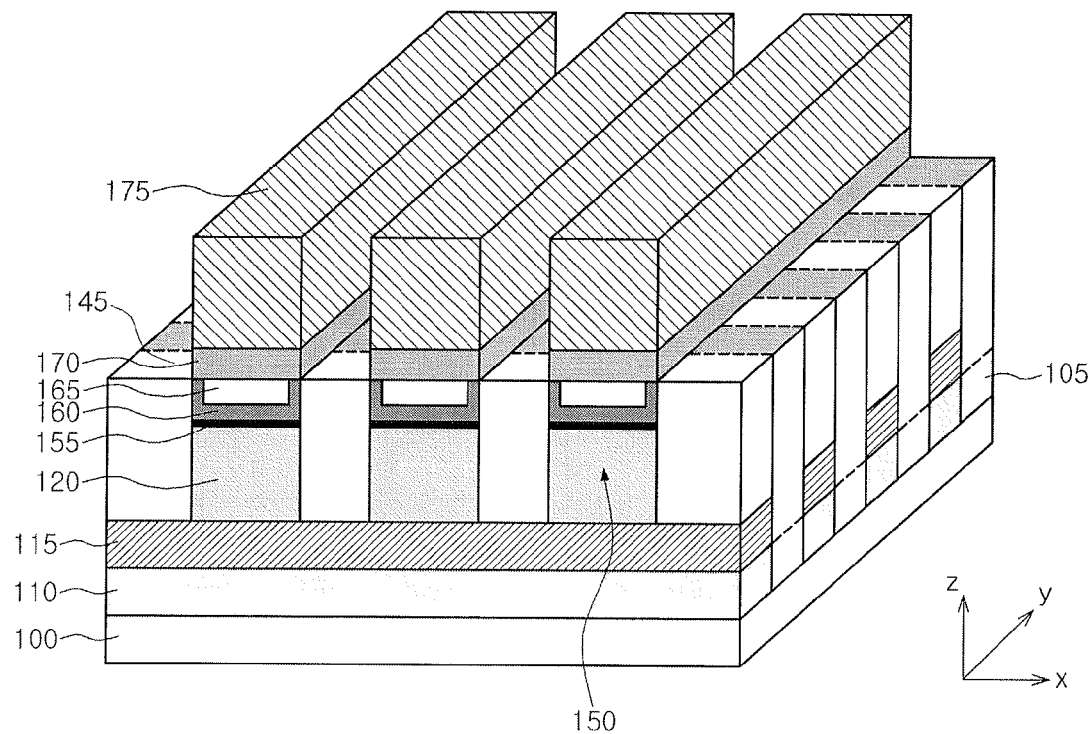
Figure 10A:
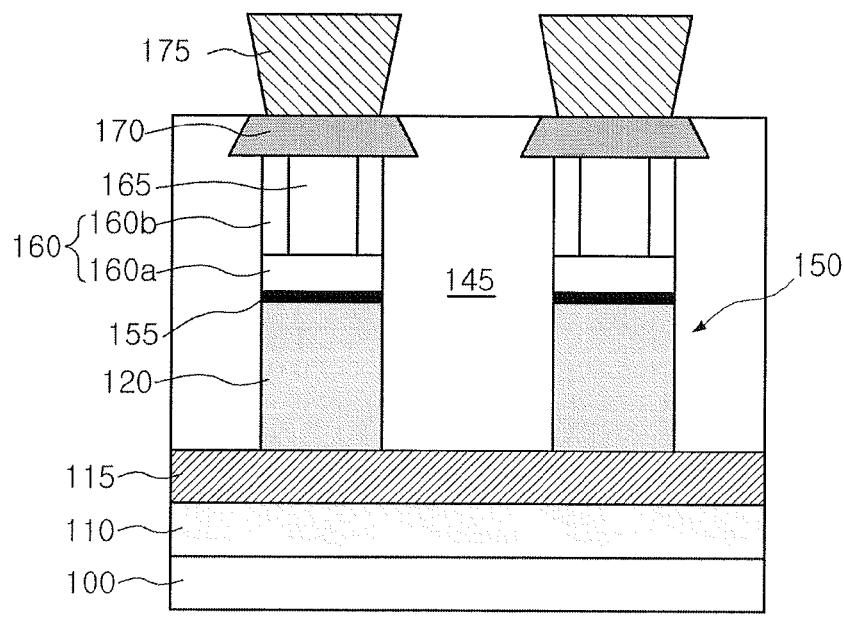
FIG. 10a is a sectional view cut in the X-direction of FIG. 9.
Figure 10B:
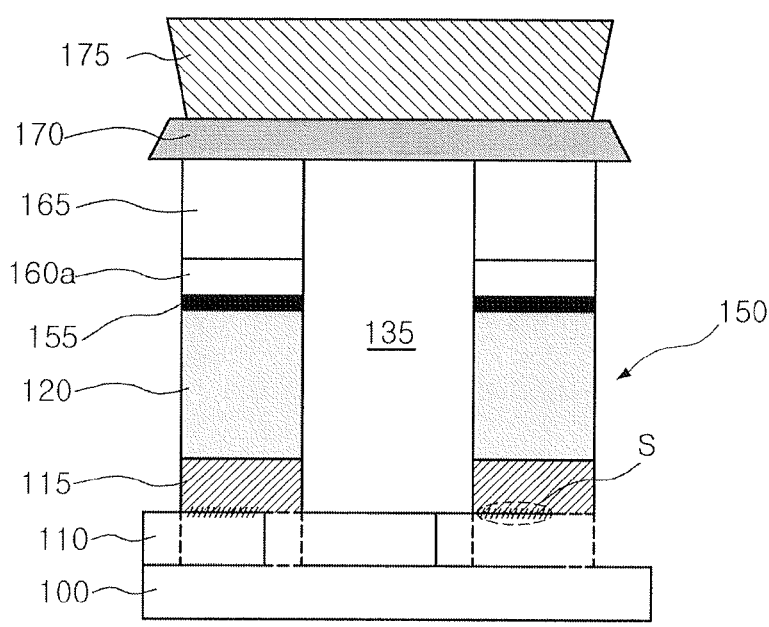
FIG. 10b is a sectional view cut in the Y-direction of FIG. 9.

Referring to FIGS. 9, 10a and 10b, ohmic contact layers 155 are selectively formed on the diode patterns 150. Subsequently, heating electrodes 160 are formed on inner surfaces of the phase change contact holes BH. The heating electrode 160 may include a bottom portion 160a (Referring to FIGS. 10a and 10b) formed on a bottom of the phase change contact hole BH and a side portion 160b (Referring to FIG. 10a) formed on a side wall of the phase change contact hole BH, for example. The heating electrodes 160 are formed by depositing a first conductive layer (not shown) for a heating electrode on the inner surfaces of the phase change contact holes BH, anisotropically etching the first conductive layer for a heating electrode to remain at the bottoms of the phase change contact holes BH, depositing a second conductive layer (not shown) for a heating electrode on the inner surfaces of the phase change contact holes BH which the bottom portions 160a (Referring to FIGS. 10a and 10b) are formed in, and anisotropically etching back the second conductive layer for a heating electrode to form side portions 160b (Referring to FIG. 10a). Accordingly, the heating electrodes 160 cover the inner surfaces of the phase change contact holes BH, for example.

Next, a phase change material layer is buried within spaces surrounded by the heating electrodes 160 to form phase change patterns 165. The heating electrodes 160 formed on the bottoms and the sides of the phase change contact holes BH apply heat to the phase change patterns 165.

A conductive layer for an upper electrode and a conductive layer for a bit line are sequentially stacked on a resultant structure of the semiconductor substrate 100 and patterned to form upper electrodes 170 and bit lines 175 to be contacted with the phase change patterns 165 and to be crossed with the metal word lines 110.

According to the exemplary embodiment, after the metal word lines 110 are completely embedded, the barrier metal layer 115 and the polysilicon layer 120 constituting the diode pattern 150 are etched so that an etching amount can be significantly reduced in cross patterning to form diodes.

Although a misalignment (a dotted line of FIG. 10b) may occur in etching the barrier metal layer 115 and the polysilicon layer 120 to be overlaid on the metal word line 100 under the state that the metal word line 110 is embedded, if the barrier metal layer 115 is electrically connected with the metal word line 110, a Schottky junction S is formed between the barrier metal layer 115 and the polysilicon layer 120 so that the diode can normally operate. According to this, the alignment margin can be ensured.

Furthermore, the self-aligned phase change contact hole BH is formed due to use of the hard mask layer 125 and subsequent removal of the hard mask layer 125, so that additional mask processes of forming the heating electrode 160 and the phase change pattern 165 are unnecessary.

While certain embodiments have been described above, it will be understood that the embodiments described are by way of example only. Accordingly, the devices and methods described herein should not be limited based on the described embodiments. Rather, the systems and methods described herein should only be limited in light of the claims that follow when taken in conjunction with the above description and accompanying drawings.

What is claimed is:

1. A method of manufacturing a phase change memory device, comprising:
   forming on a semiconductor substrate a first insulating layer having a plurality of metal word lines spaced apart at a constant distance;
   forming a plurality of line structures overlaying the plurality of metal word lines, each of the plurality of line structures comprising a barrier metal layer, a polysilicon layer and a hard mask layer;
   burying a second insulating layer between the line structures;
   forming cross patterns by etching the hard mask layers and the polysilicon layers of the plurality of line structures using mask patterns crossed with the metal word lines;
   burying a third insulating layer within spaces between the cross patterns; and
   forming self-aligned phase change contact holes and simultaneously forming diode patterns formed of remnant polysilicon layers by selectively removing the hard mask layers constituting the cross patterns.

2. The method of claim 1, wherein the forming the first insulating layer comprises:
   forming an insulating layer on the semiconductor substrate;
   forming a plurality of line holes which are disposed in parallel with each other within the insulating layer;
   forming a metal layer to be buried within the plurality of line holes; and
   polishing the metal layer to expose the insulating layer.

3. The method of claim 1, further comprising:
   forming ohmic contact layers on the diode patterns;
   forming heating electrodes on inner surfaces of the phase change contact holes; and
   forming phase change patterns within spaces surrounded by the heating electrodes.

4. The method of claim 3, wherein the forming heating electrodes comprises:
   forming a first conductive layer on the inner surfaces of the phase change contact holes;
   forming bottom portions on bottoms of the phase change contact holes by anisotropically etching the first conductive layer;
   forming a second conductive layer on the inner surfaces of the phase change contact holes in which the bottom portions are formed in; and
   forming side portions by anisotropically etching back the second conductive layer.

5. The method of claim 3, wherein the forming phase change patterns includes:
   forming a phase change material layer to be buried within spaces surrounded by the heat electrodes; and
   chemically mechanically polishing the phase change material layer.

6. The method of claim 3, further comprising:
   forming upper electrodes on the phase change patterns; and
   forming bit lines on the upper electrodes.

7. A method of manufacturing a phase change memory device, comprising:
   providing a semiconductor substrate having a plurality of metal word lines insulated from each other and having a planarized surface formed thereon;
   forming a plurality of line structures overlaying the plurality of metal word lines, each of the plurality of line structures comprising a barrier metal layer, a polysilicon layer for a diode and a hard mask layer;
   burying an insulating layer between the line structures; and
   forming cross patterns by etching the hard mask layers and the polysilicon layers of the plurality of line structures by using mask patterns crossed with the plurality of metal word lines.

8. The method of claim 7, wherein the providing a semiconductor substrate comprises:
   forming an interlayer insulating layer on the semiconductor substrate;
   forming a plurality of line type grooves by etching portions of the interlayer insulating layer;
   forming a metal layer to be buried within the plurality of line type grooves; and
   forming the plurality of metal word lines by chemically mechanically polishing the metal layer.

9. The method of claim 7, wherein the providing a semiconductor substrate comprises:
   forming a metal layer on the semiconductor substrate;
   forming a plurality of metal word lines by etching portions of the metal layer; and
   burying an insulating layer within spaces between the metal word lines.

10. A method of manufacturing a phase change memory device, comprising:
    forming a plurality of line structures on a semiconductor substrate, each of the plurality of line structures comprising a metal word line, a barrier metal layer, a polysilicon layer and a hard mask layer sequentially stacked;
    burying an insulating layer between the line structures;
    forming cross patterns by etching the hard mask layers and the polysilicon layers of the plurality of line structures by using mask patterns crossed with the plurality of line structures;
    burying an additional insulating layer within spaces between the cross patterns; and
    forming self-aligned phase change contact holes and simultaneously forming diode patterns formed of remnant polysilicon layers by selectively removing the hard mask layers constituting the cross patterns.

11. The method of claim 10, further comprising:
    forming ohmic contact layers on the diode patterns;
    forming heating electrodes on inner surfaces of the phase change contact holes; and
    forming phase change patterns within spaces surrounded by the heating electrodes.

12. The method of claim 11, wherein the forming heating electrodes comprises:
    forming a first conductive layer on the inner surfaces of the phase change contact holes;
    forming bottom portions on bottoms of the phase change contact holes by anisotropically etching the first conductive layer;
    forming a second conductive layer on the inner surfaces of the phase change contact holes in which the bottom portions are formed in; and
    forming side portions by anisotropically etching back the second conductive layer.

13. The method of claim 11, wherein the forming phase change patterns comprises:
    forming a phase change material layer to be buried within spaces surrounded by the heat electrodes; and
    chemically mechanically polishing the phase change material layer.

* * * * *